(12) United States Patent
Bradley

(10) Patent No.: US 12,300,993 B2
(45) Date of Patent: *May 13, 2025

(54) APPARATUS FOR DETECTION OF ELECTRICAL DISTURBANCES RESULTING FROM ELECTROMAGNETIC PULSE AND SOLAR STORM

(71) Applicant: Arthur Thomas Bradley, Yorktown, VA (US)

(72) Inventor: Arthur Thomas Bradley, Yorktown, VA (US)

(73) Assignee: Faraday Defense Corporation, Kalamazoo, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/669,443

(22) Filed: May 20, 2024

(65) Prior Publication Data

US 2024/0313526 A1 Sep. 19, 2024

Related U.S. Application Data

(62) Division of application No. 17/649,919, filed on Feb. 3, 2022, now Pat. No. 11,990,746.

(Continued)

(51) Int. Cl.
*H02H 9/04* (2006.01)
*G01R 31/00* (2006.01)
(Continued)

(52) U.S. Cl.
CPC ........... *H02H 9/045* (2013.01); *G01R 31/001* (2013.01); *H02H 3/22* (2013.01); *H02H 5/005* (2013.01); *H02H 9/041* (2013.01)

(58) Field of Classification Search
CPC .......... H02H 9/045; H02H 9/041; H02H 3/22; H02H 5/005; G01R 31/001
(Continued)

(56) References Cited

U.S. PATENT DOCUMENTS

| 4,553,189 A | 11/1985 | Pivit |
| 4,669,027 A | 5/1987 | Elsner |

(Continued)

FOREIGN PATENT DOCUMENTS

| EP | 2244353 A2 | 10/2010 |
| WO | WO2019139933 | 7/2019 |

OTHER PUBLICATIONS

International Search Report and Written Opinion by the European Patent Office as International Searching Authority in PCT application PCT/US2022/076889 of 24 pages mailed Apr. 3, 2023.

(Continued)

*Primary Examiner* — Kevin J Comber
(74) *Attorney, Agent, or Firm* — Patents and Licensing LLC; Daniel W Juffernbruch

(57) ABSTRACT

An apparatus detects complex time-variant electromagnetic disturbances resulting from a high-altitude nuclear electromagnetic pulse (EMP) or solar storm. The device relies on a circuit (104, 1301) to monitor the input power lines (301, 401, 501) for sustained conducted electrical disturbances associated with the E3 phase of an EMP or solar storm. A separate circuit (105, 1302) monitors the power lines and the ambient environment (503) for transient electromagnetic pulse disturbances associated with the E1 and E2 phases of an EMP. A housing (901, 902) has a pair of AC mains wall plug prongs (905) extending from a side. When sustained electrical disturbances or transient electromagnetic pulse disturbances are detected, the apparatus provides a visual alarm (603, 609), audible alarm (608), and discrete indication signal (607) that can be used to disconnect (702) or redirect the flow of electrical power.

36 Claims, 13 Drawing Sheets

Related U.S. Application Data

(60) Provisional application No. 63/251,090, filed on Oct. 1, 2021.

(51) Int. Cl.
 *H02H 3/22* (2006.01)
 *H02H 5/00* (2006.01)

(58) Field of Classification Search
 USPC ................ 361/91.6; 324/71.11; 455/334
 See application file for complete search history.

(56) References Cited

U.S. PATENT DOCUMENTS

| | | | |
|---|---|---|---|
| 5,144,517 A | 9/1992 | Wieth | |
| 5,388,021 A | 2/1995 | Stahl | |
| 5,978,198 A | 11/1999 | Packard | |
| 6,226,162 B1 | 5/2001 | Kladar | |
| 6,392,318 B1 | 5/2002 | Griffis | |
| 6,847,514 B2 | 1/2005 | Ramarge | |
| 9,450,410 B2 | 9/2016 | Moore | |
| 9,748,759 B1* | 8/2017 | Bergeron | H02H 3/00 |
| 10,530,151 B2 | 1/2020 | Carty | |
| 10,742,025 B2 | 8/2020 | Carty | |
| 10,938,204 B1 | 3/2021 | Carty | |
| 11,171,483 B2 | 11/2021 | Doynov | |
| 11,239,654 B1 | 2/2022 | Bradley | |
| 2007/0298724 A1* | 12/2007 | Sulkowski | H04B 17/23 |
| | | | 455/67.13 |
| 2010/0127625 A1 | 5/2010 | Minarczyk | |
| 2011/0089929 A1* | 4/2011 | Jackson | G01R 29/0814 |
| | | | 324/72 |
| 2012/0019962 A1* | 1/2012 | Faxvog | H02H 7/0455 |
| | | | 327/551 |
| 2012/0147509 A1 | 6/2012 | Mechanic | |
| 2012/0194152 A1 | 8/2012 | Martinelli | |
| 2013/0308229 A1 | 11/2013 | Faxvog | |
| 2015/0004847 A1 | 1/2015 | Namkoong | |
| 2016/0126738 A1 | 5/2016 | Moore | |
| 2016/0197469 A1 | 7/2016 | Fuchs | |
| 2016/0231367 A1* | 8/2016 | Cox | G01R 29/0814 |
| 2017/0187181 A1 | 6/2017 | Kashyap | |
| 2017/0299642 A1 | 10/2017 | Ribiere-Tharaud | |
| 2018/0136267 A1 | 5/2018 | Yao | |
| 2019/0036326 A1 | 1/2019 | Anderson | |
| 2019/0214814 A1 | 7/2019 | Carty | |
| 2021/0080495 A1 | 3/2021 | Kajbaf | |

OTHER PUBLICATIONS

Preliminary Search Report by the European Patent Office as International Searching Authority in PCT application PCT/US2022/076889 of 16 pages mailed Jan. 12, 2023.

* cited by examiner

| Waveform Component | Coupling Method | Couples Into | Typical Duration |
|---|---|---|---|
| E1 | Radiated, Conducted | Couples directly into small-scale and large-scale electronics | Nanoseconds |
| E2 | Radiated, Conducted | Couples directly into small-scale and large-scale electronics | Microseconds |
| E3 | Induction, Conducted | Couples into large-scale infrastructures and propagates by conduction to affect smaller systems | Seconds to Hours |

FIG. 12

APPARATUS FOR DETECTION OF ELECTRICAL DISTURBANCES RESULTING FROM ELECTROMAGNETIC PULSE AND SOLAR STORM

CROSS-REFERENCE TO RELATED APPLICATIONS

This application claims priority benefits under 35 U.S.C. §§ 119(e) and 120 to U.S. application Ser. No. 17/649,919, filed on Feb. 3, 2022 which claims priority benefits to U.S. provisional application No. 63/251,090, filed on Oct. 1, 2021. Such prior applications are incorporated herein by reference as if set forth in full herein.

BACKGROUND OF THE INVENTIONS

1. Technical Field

The present inventions relate to the detection of complex, time-variant conducted and radiated disturbances resulting from an electromagnetic pulse (EMP); solar storm that results in a solar flare, coronal mass ejection (CME), or geomagnetic disturbance; directed energy weapon; inadequate voltage regulation by the power provider; or other event that manifests as voltage or current fluctuations in electrically conductive wires, traces, or circuits.

2. Description of the Related Art

Lightning detection devices observe the ambient environment for radiated electromagnetic disturbances with durations on the order of 50-200 microseconds, timing that is indicative of a lightning event.

Another technology that might be considered comparable is that of power line monitors used for purposes of testing incoming power line connections for unwanted conditions such as open ground, reverse polarity, and steady-state high or low voltage levels. However, such devices do not possess the ability to detect very brief conducted electromagnetic disturbances, such as those of the conducted and radiated pulses associated with E1 and E2 phases of an EMP.

While there have been a few complex methods proposed to detect the occurrence of an EMP, they rely on the use of artificial intelligence, sophisticated signal processing, or multi-node networking of large infrastructures.

BRIEF DESCRIPTION OF THE DRAWINGS

The present inventions are illustrated by way of example and are not limited by the accompanying figures, in which like references indicate similar elements. Elements in the figures are illustrated for simplicity and clarity and have not necessarily been drawn to scale or complexity.

The details of the preferred embodiments will be more readily understood from the following detailed description when read in conjunction with the accompanying drawings wherein:

FIG. 12 summarizes the three waveform components of an EMP, how they couple, and their typical durations.

DETAILED DESCRIPTION OF THE PREFERRED EMBODIMENTS

The present inventions are used to detect complex, time-variant conducted and radiated disturbances resulting from an EMP or solar storm. The present inventions comprise circuits that continuously monitor input power lines for the purpose of detecting sustained level disturbances associated with E3, having durations of seconds to hours, and circuits that continuously monitor both the input power lines and the ambient environment for the purpose of detecting pulse electromagnetic disturbances associated with E1 and E2, having durations of nanoseconds to microseconds. When a sustained level or pulse disturbance is detected, a visual alarm, audible alarm, and discrete indication signal are generated. The signal alarm indicator can be used to inform a microcontroller or microprocessor of the alarm condition, and to drive a power switching element, such as an electronically-controlled circuit breaker or an automatic transfer switch, for the purpose of automatically disconnecting power or redirecting the flow of power.

Figure 1:
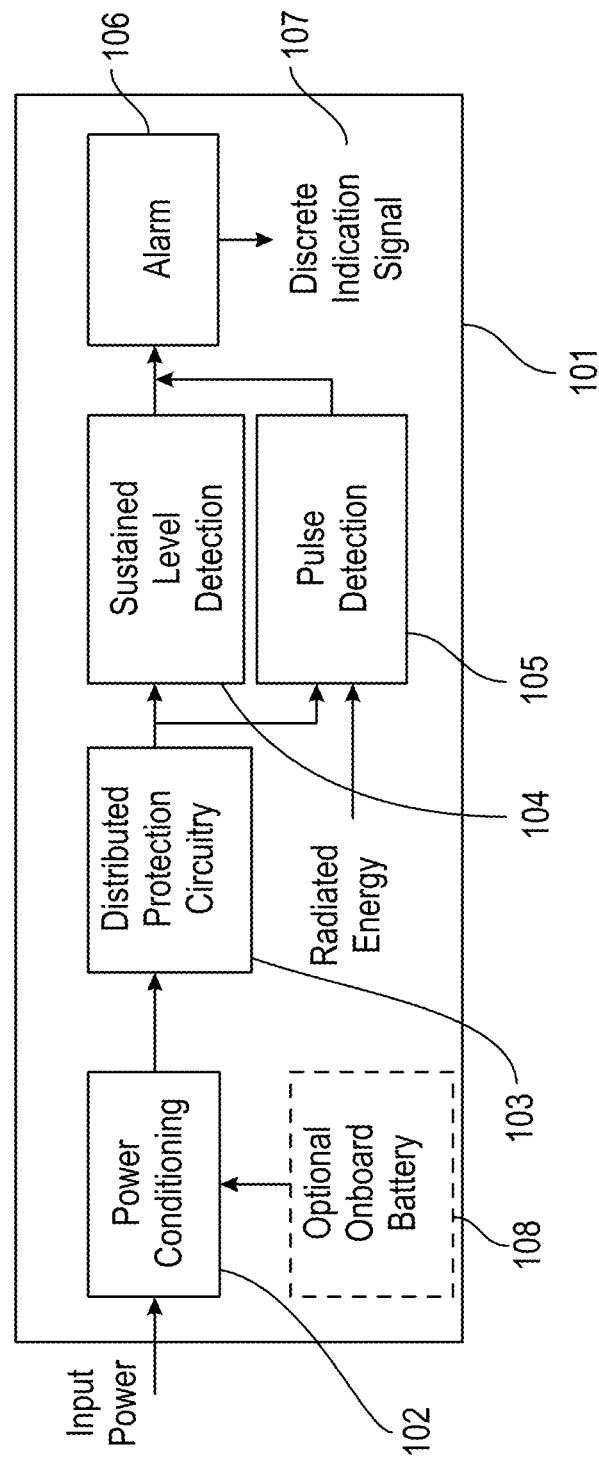
FIG. 1 illustrates a block diagram showing an enclosure, power conditioning circuit, distributed protection circuitry, sustained level detection circuit, pulse detection circuit, alarm circuit, power disconnect switch circuit, and optional onboard battery according to embodiments of the present inventions.

FIG. 1 illustrates a high-level block diagram of the apparatus containing the present inventions. Enclosure 101 may be shielded with a conductive barrier to suppress out-of-band electromagnetic energy that might cause a false alarm. The power conditioning circuit 102 converts incoming electrical power to electrical power with characteristics more readily used by the apparatus's electronics. Such power conditioning might not be necessary in the case where input power was already directly usable by the apparatus's circuitry. Protection circuitry 103 is distributed throughout, enabling it to better survive extreme electrical and electromagnetic transients, such as those resulting from an EMP or solar storm. Protection circuitry could consist of transient voltage suppressors, metal oxide varistors, gas discharge tubes, and other transient surge protection devices. The sustained level detection circuit 104 monitors the input power line for voltage disturbances associated with the E3 phase, having durations of seconds to hours. Likewise, the pulse detection circuit 105 monitors the input power line and the ambient radiated environment for transient electromagnetic pulse disturbances associated with the E1 and E2 phases, having durations from nanoseconds to microseconds. Both the sustained detection circuit 104 and pulse detection circuit 105 provide signals to the alarm circuit 106, indicating the detection of a disturbance associated with an EMP or solar storm. The alarm circuit 106 in turn activates a visual indicator, an audible indicator, and a discrete indication signal 107 that can be used to inform an external processing element of the detection, as well as trigger the disconnect or rerouting of the flow of electrical power. An onboard battery 108 would be required in portable embodiments to provide power to the circuit elements.

Figure 2:
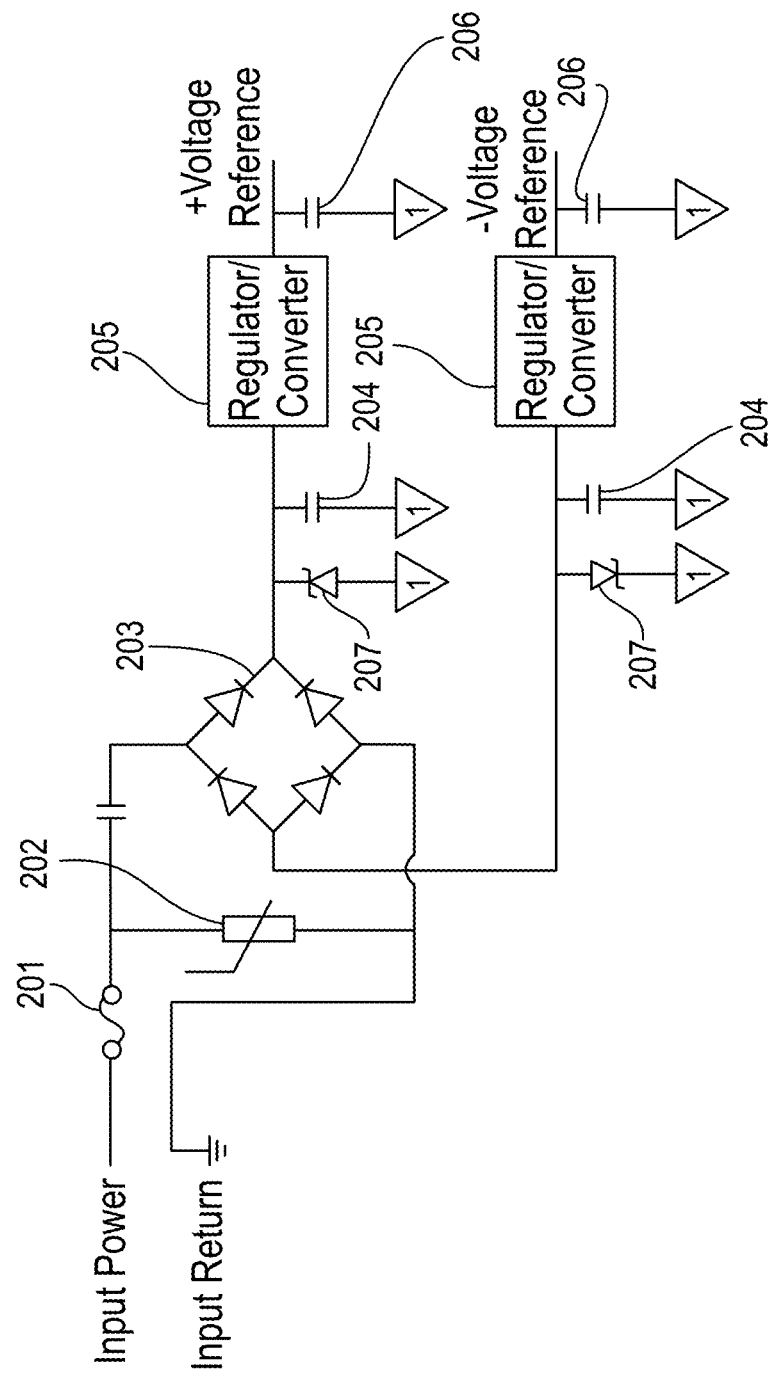
FIG. 2 illustrates a simplified schematic diagram showing the power conditioning circuit; this particular embodiment comprises a fuse, protective varistor, series capacitor, bridge rectifier, zener diodes, and linear regulators or switched converters according to embodiments of the present inventions.

FIG. 2 illustrates a simplified schematic of the power conditioning circuit 103. The power conditioning circuit converts incoming electrical power to electrical power with characteristics more readily used by the apparatus's electronics. The input power line may be fused 201 for safety and circuit protection. Additionally, a metal-oxide varistor (MOV) or other transient protection device 202 can be used to limit the incoming voltage disturbance that might result from an EMP or solar storm. A bridge rectifier 203 is tapped from both sides to feed nodes that are voltage limited by zener diodes 207 and ripple limited by capacitors 204. Power is then fed to linear regulators, dc-dc converters, or other power conversion devices 205 to provide the voltages, currents, and performance characteristics required by the specific embodiment of the apparatus. Capacitors 206 are used at the output of the power converters to ensure stability and ripple performance.

Figure 3:
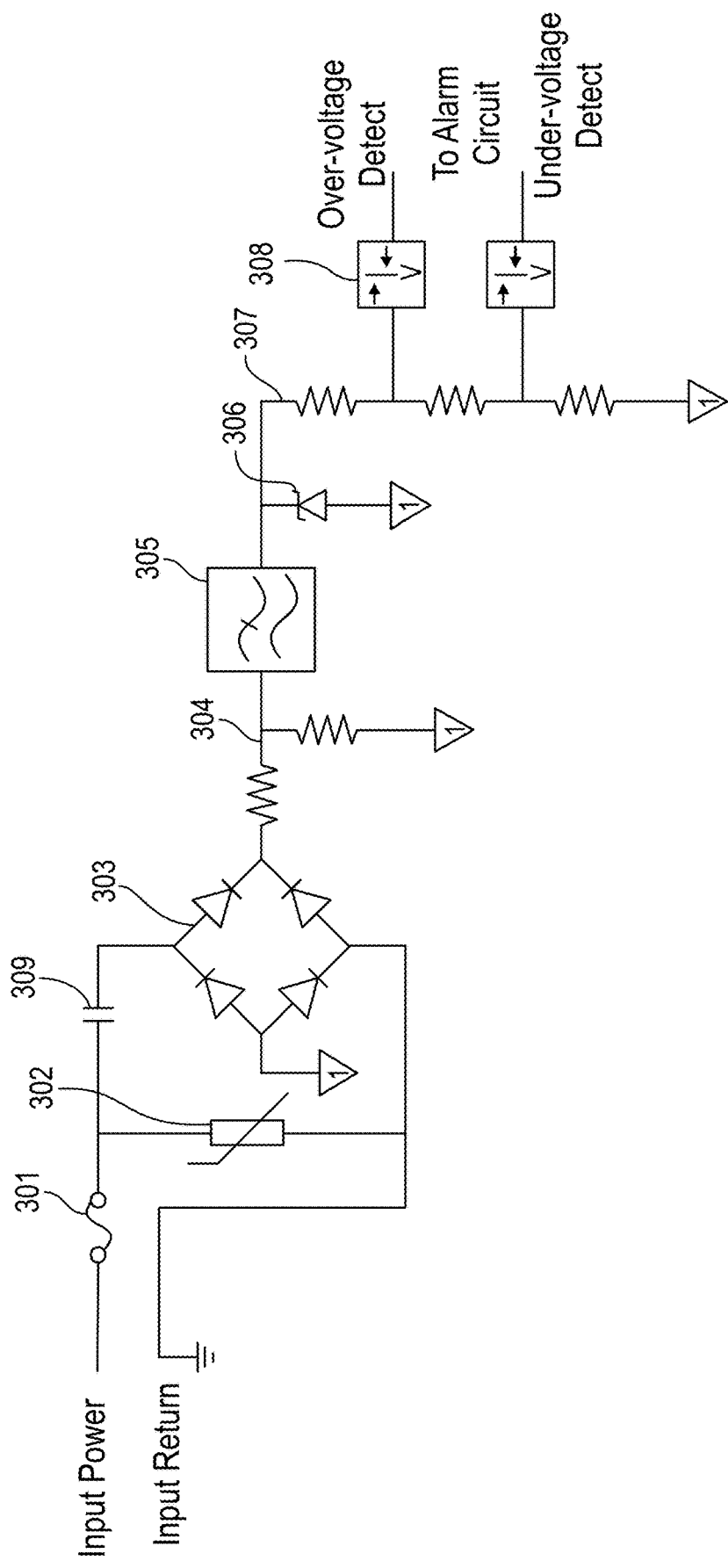
FIG. 3 illustrates a simplified schematic diagram of the sustained level detection circuit; this particular embodiment comprises a fuse, protective varistor, bridge rectifier, voltage divider, low-pass filter, transient voltage suppressor diode, comparator input voltage divider, and window comparator according to embodiments of the present inventions.

FIG. 3 illustrates a simplified schematic of the sustained level detector 104, which monitors the input power line for voltage disturbances associated with the E3 phase. The sustained level detector detects sustained electrical disturbances associated with an E3 phase of at least one of an electromagnetic pulse and a solar storm. The sustained level detector identifies disturbance durations ranging from seconds to hours. The input may be fused 301 and protected from severe overvoltage conditions by transient protection device 302. The input power line also features a series current-limiting resistor 309. A bridge rectifier 303 is used along with a voltage divider 304 to rectify and scale the incoming voltage level. A low-pass filter 305 passes durations ranging from seconds to hours by turning the level into a quasi-dc representation, which is limited in magnitude by the zener diode 306. A minimum end of the seconds to hours range could be chosen at about 60 milliseconds to about 100 milliseconds because one period of a 60 Hz waveform is 16.6 milliseconds or for 50 Hz is 20 milliseconds. Five periods is considered enough to get a reasonable average of the signal, but other average durations also work. A resistor network 307 is used to create inputs to the over-voltage and under-voltage comparators 308. The resistors can either be fixed, or variable (i.e., potentiometers) to allow dynamically adjusting the over-voltage and under-voltage trip points. The comparators either have threshold values determined by supporting components or can be window comparators with predefined upper and lower trigger thresholds. The outputs of the comparators feed directly to the alarm circuit.

Figure 4:
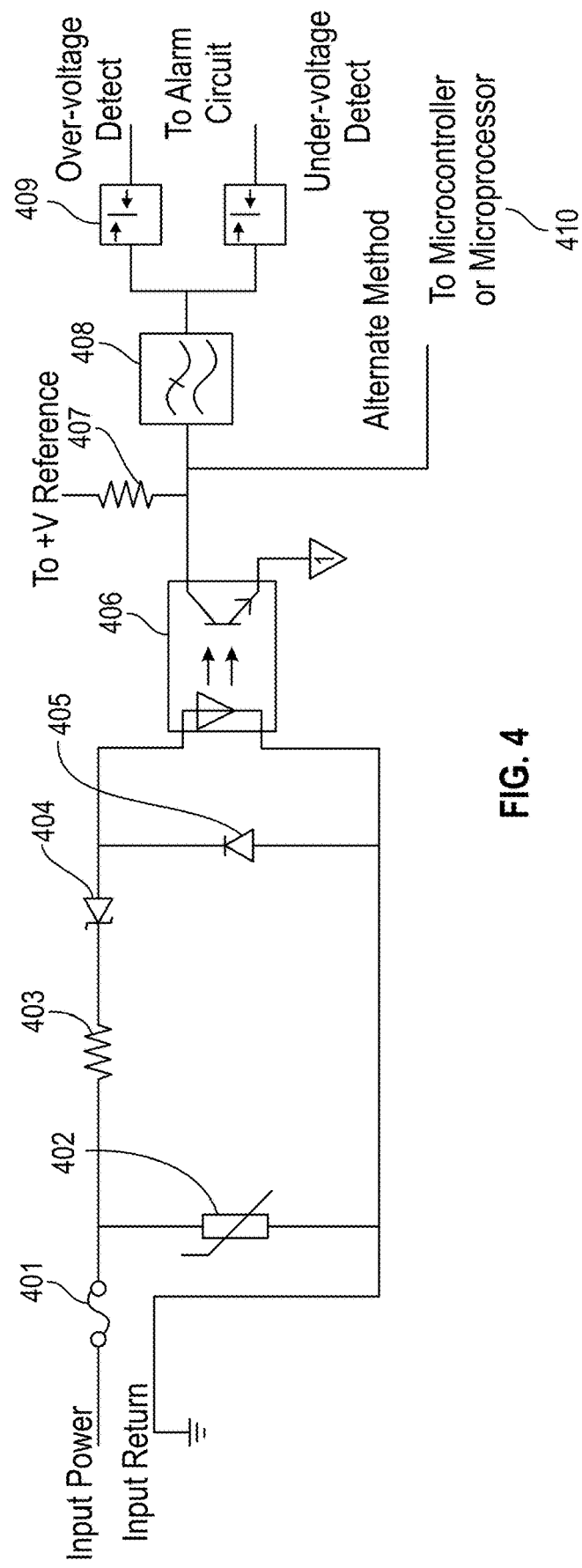
FIG. 4 illustrates a simplified schematic diagram of an alternate embodiment of a sustained disturbance detection circuit; this particular embodiment comprises a fuse, protective varistor, current limiting resistor, sustained level threshold setting zener diode, reverse protective diode, optocoupler, bias resistor, low-pass filter, and window comparator according to embodiments of the present inventions.

FIG. 4 illustrates an alternate embodiment of the sustained disturbance detection circuit 104. The input power may be fused 401 and protected from severe overvoltage conditions by transient protection device 402. A resistor 403 limits the current flowing into the optocoupler 406 and can be placed before or after the zener diode 404. Zener diode 404 rectifies the input waveform, and its turn-on voltage sets the minimum voltage at which the optocoupler 406 activates. Diode 405 provides a reverse current path for negative going swings of the input voltage, helping to safeguard the optocoupler. The optocoupler 406 converts the rectified input power signal to a pulse train whose pulse width is determined by the input voltage level, waveform frequency, and DC offset. Resistor 407 provides the necessary voltage reference to the optocoupler open collector output. The low-pass filter 408 converts the pulse train into an analog signal representative of the input power voltage level and sustained disturbance. This analog signal is compared to setpoints in the comparators 409. Over-voltage and under-voltage detection signals are routed to the alarm circuit. The low pass filter and comparators can also be replaced with a microcontroller or microprocessor 410, which counts the number of pulses to determine the input power voltage level and sustained disturbance.

Figure 5:
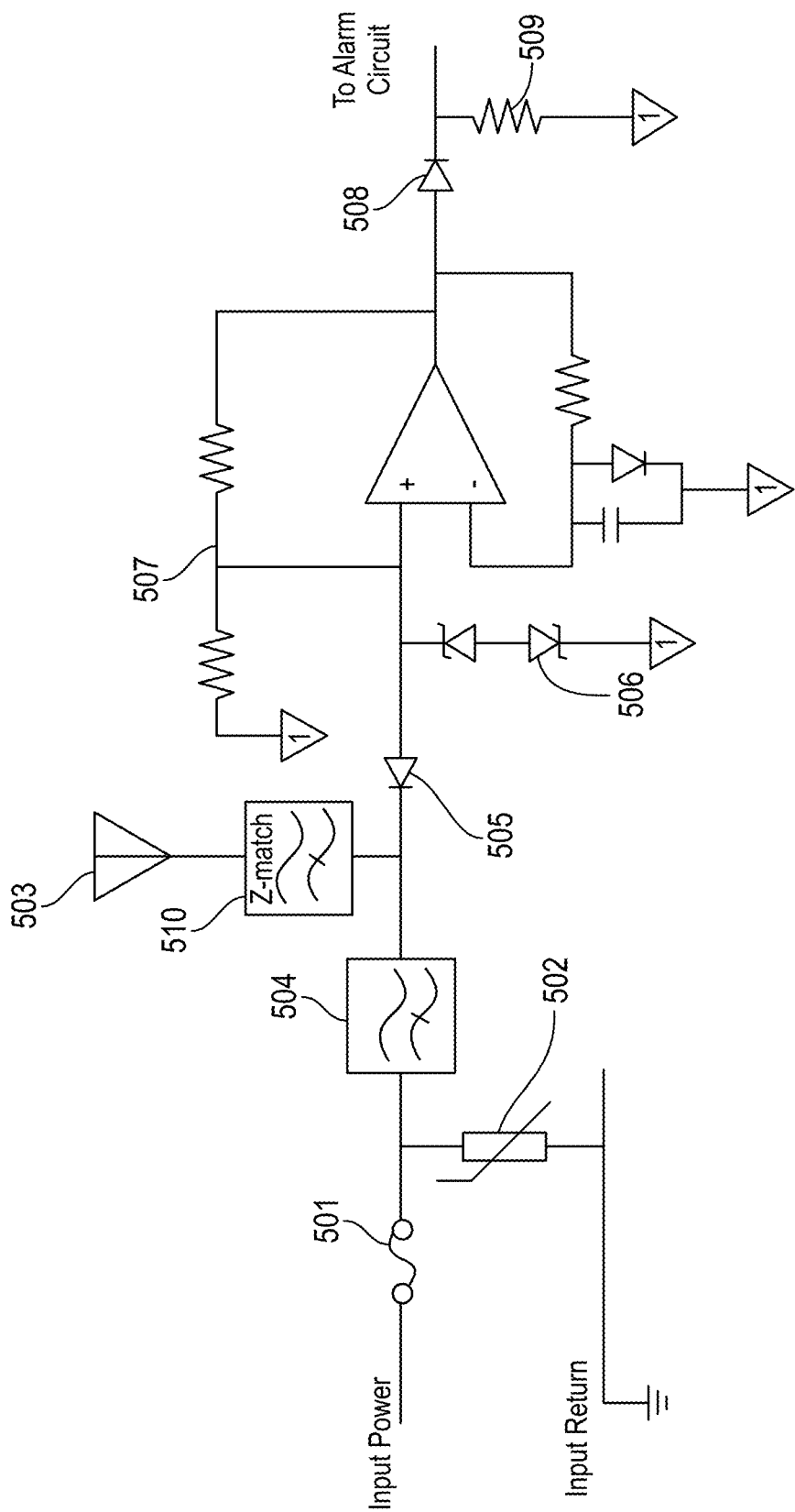
FIG. 5 illustrates a simplified schematic diagram of the transient disturbance detection circuit; this particular embodiment comprises a fuse, protective varistor, high-pass filter, impedance-matched filter, bidirectional transient voltage suppression diode, high-speed monostable multivibrator pulse detector, blocking diode, and pull-down bias resistor according to embodiments of the present inventions.

FIG. 5 illustrates a simplified schematic of the pulse detector 105, which monitors the input power line and the ambient radiated environment for transient electromagnetic pulse disturbances associated with the E1 and E2 phases. The pulse detector 105 detects transient electromagnetic pulse disturbances associated with E1 and E2 phases of at least one of an electromagnetic pulse and a solar storm. The pulse detector 105 responds to pulse disturbance durations ranging from nanoseconds to microseconds. The input may be fused 501 and protected from severe overvoltage conditions by transient protection device 502. The combination of input power and conducted transient electromagnetic pulse disturbance are passed through a high-pass filter 504. The high-pass filter passes pulse disturbance durations ranging from nanoseconds to microseconds. A minimum end of the nanoseconds to microseconds range could be chosen at about 10 nanoseconds or about 20 nanoseconds because EMP detonations were measured to have a minimum E1 duration of near 20 nanoseconds. The high-pass filter 504 also removes unwanted frequencies, including the frequency of power transmission. An antenna 503 also connects to the input power node through an impedance-matched filter 510 to maximize the power transfer of the radiated transient electromagnetic pulse disturbance. The antenna 503 has an electrical length with a resonant frequency tuned to a frequency spectrum of the transient electromagnetic pulse disturbances. A diode 505 works in conjunction with the filters to act as a differentiator, turning either positive-to-negative or negative-to-positive signal edge transitions into a sharp transient impulse. A bidirectional transient protection device 506 ensures that the impulse voltage levels do not exceed the op-amp's allowed input voltage range. The impulse is input to a very high-bandwidth op-amp configured as pulse detector as a monostable multivibrator 507. The pulse detector is a two-state pulse-triggered detection circuit using edge, pulse, or impulse detection. An edge, pulse, or impulse at the pulse detector input causes its output to change state. The monostable multivibrator 507 is one preferred embodiment of the pulse detector. Alternative embodiments can be peak detection devices, high-speed samplers, flip flops, high-gain comparators, and transient protection devices with very fast turn on times. In a preferred embodiment, the output of the multivibrator is an active-low pulse whose pulse width is set by the passive components of the multivibrator. A blocking diode 508 is used to prevent the shared connections in the alarm circuit from affecting the multivibrator performance. A resistor 509 provides biasing for the alarm circuit connection. The output is routed to the alarm circuit 106.

Figure 6:
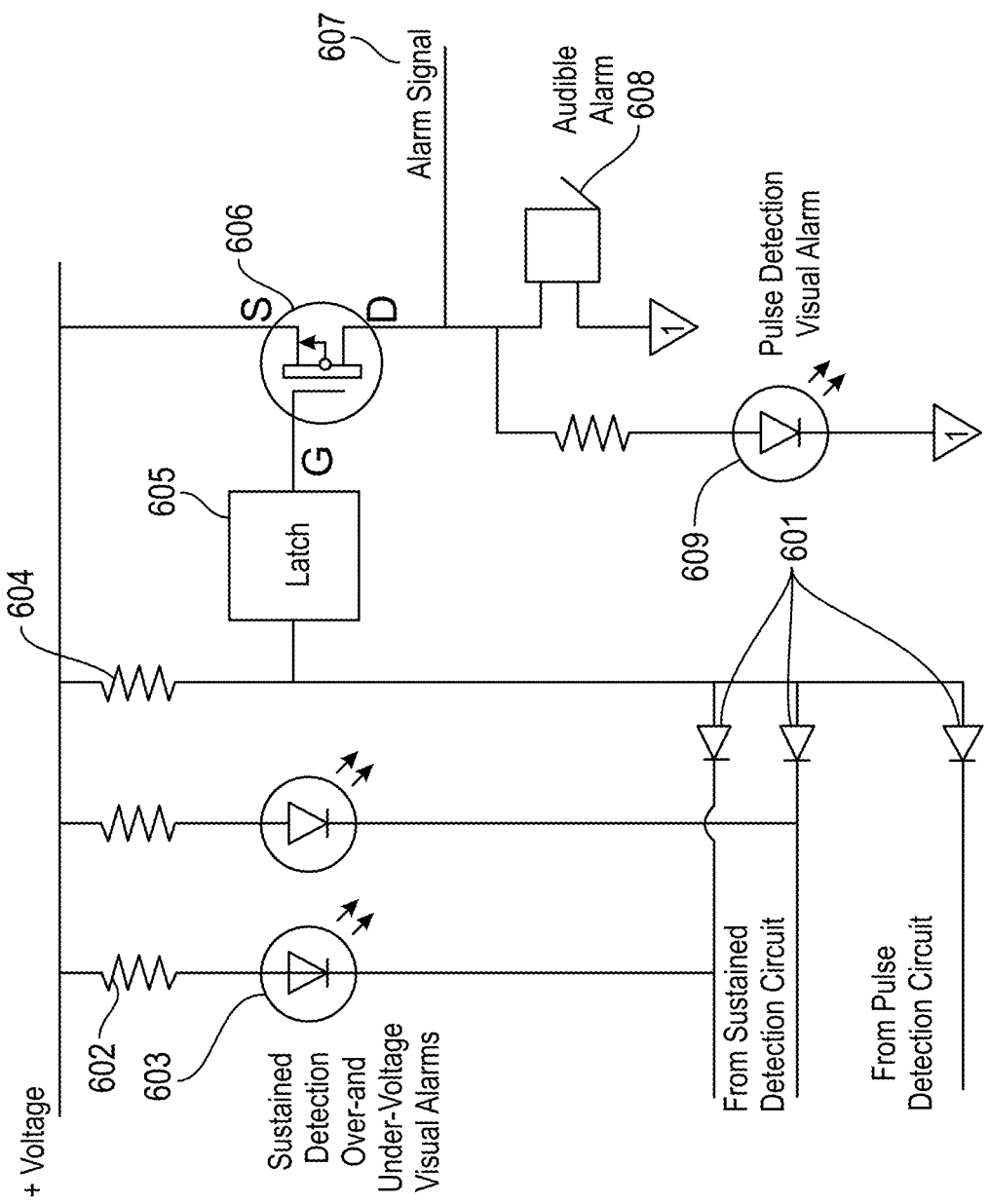
FIG. 6 illustrates a simplified schematic diagram of the alarm circuit; this particular embodiment comprises light-emitting diodes, wired- or connected diodes, a p-channel field effect transistor, an optional resettable latch, an audible alarm, and an output alarm signal according to embodiments of the present inventions.

FIG. 6 illustrates a simplified schematic of the alarm circuit 106, which is fed by the sustained detection circuit 104 and the pulse detection circuit 105. Outputs of the sustained detection and pulse detection circuits are wire-OR'd together using diodes 601. Current limiting resistors 602 and light-emitting diodes 603 provide a visual warning of sustained over-voltage, sustained under-voltage, and pulse disturbance conditions. Likewise, a light-emitting diode circuit 609 provides a visual warning of pulse detection. Resistor 604 along with resistor 509 are used to set the bias point on the gate of the p-channel MOSFET 606. The specific embodiment described in FIGS. 4 and 5 provide different alarms for sustained under voltage (a pulsing beep-beep-beep), sustained over voltage (a continuous beep), and pulse disturbance (a single controlled-duration beep). An inline latch 605 can also be used to hold the state of the driving signal, if so desired. Such a latch would be either manually resettable or reset automatically with an internal timer, not shown. The p-channel MOSFET 606 acts as a switch, providing power to the audible alarm 608 when the sustained or pulse disturbance conditions are detected. Additionally, an alarm signal 607 can be used as a trigger to disconnect power or redirect the flow of electrical power to an alternate path. The discrete indication signal can also be used to send a text or email or TCP/IP signal or couple to a Bluetooth or WiFi or cellular radio or 5G internet of things transceiver to transmit an alarm, in various alternate embodiments.

Figure 7:
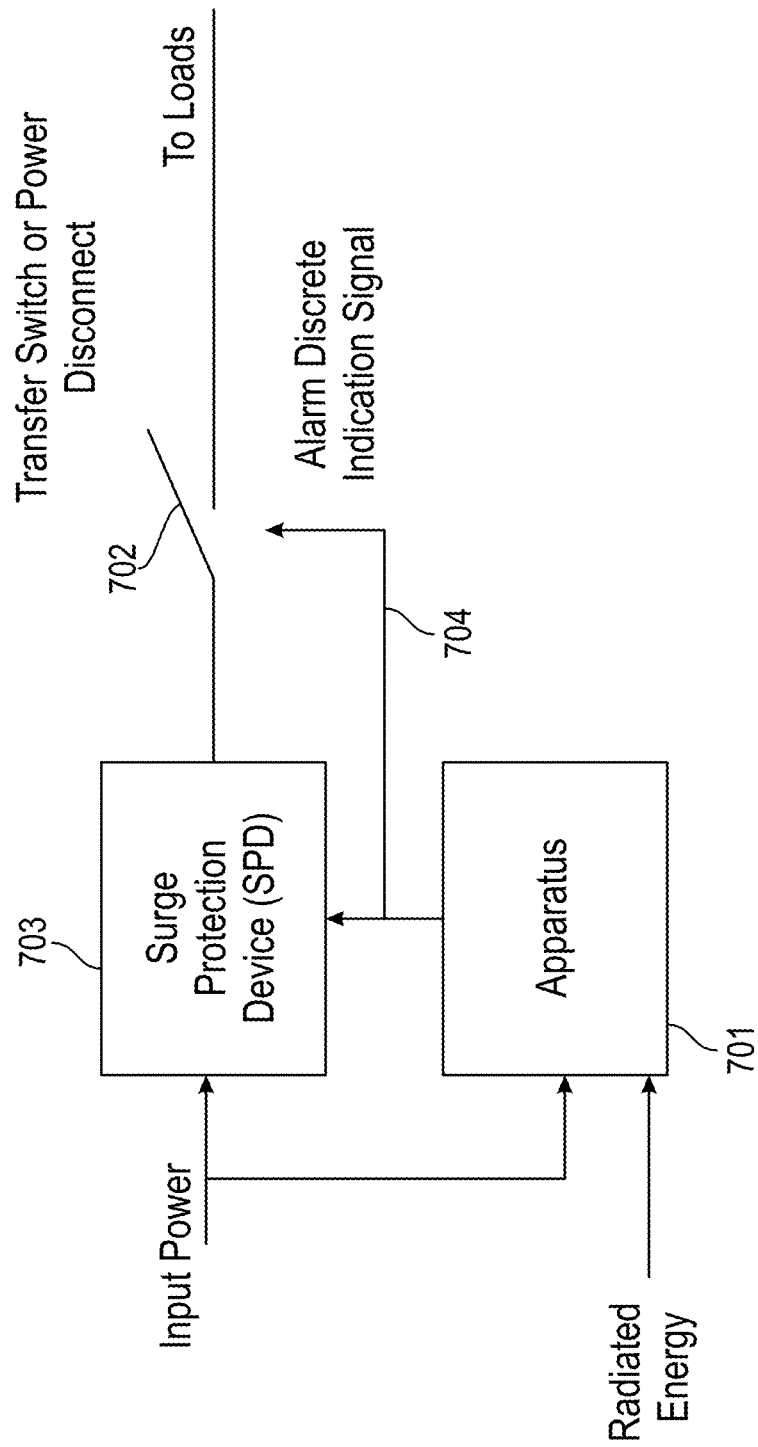
FIG. 7 illustrates a block diagram of the alarm signal generated by the pulse detector and sustained level detector used to disconnect electrical power or redirect the flow of electrical power to an alternate path according to embodiments of the present inventions.

FIG. 7 illustrates a simplified block diagram of the apparatus 701 being used to monitor the input power line of a surge protection device (SPD). In the event of a sustained level disturbance or transient electromagnetic pulse disturbance associated with an EMP or solar storm, the apparatus's internal alarm circuit will activate a visual indicator and an audible indicator. It can also send a discrete indication signal 704 to an upstream or downstream power disconnect or transfer switch, interrupting or rerouting the flow of electrical power. In this embodiment, the apparatus 701 could draw its power either from a self-contained energy storage device, such as a battery, from the power line that it is monitoring, or from some external tertiary power source.

Figure 8:
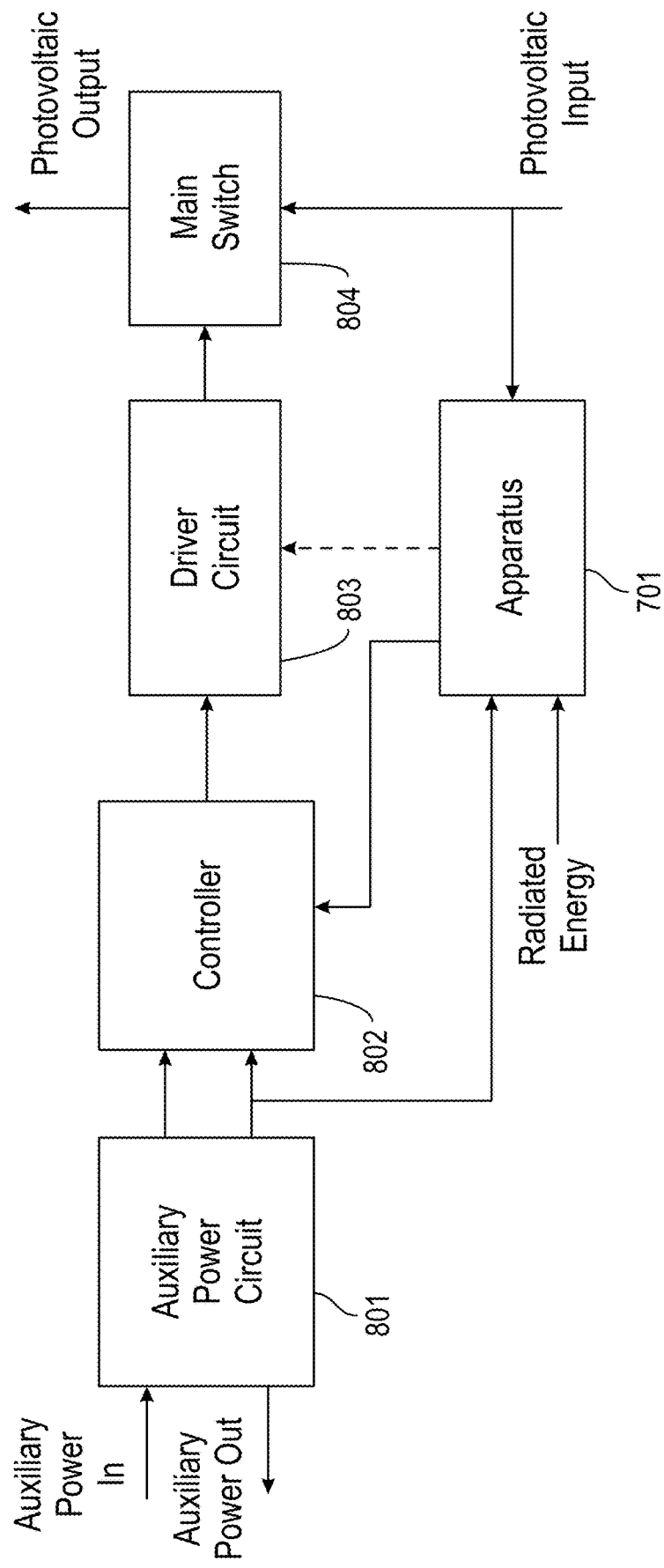
FIG. 8 illustrates a block diagram of an embodiment being incorporated into a safety cutoff switch of a solar power generation system; in this embodiment, the sustained level detector and pulse detector circuits monitor the photovoltaic power and auxiliary power lines for disturbances indicative of an EMP or solar storm; if such an event is detected, the detectors send an alarm to the controller or the driver circuit to force the disconnection of photovoltaic power.

FIG. 8 illustrates a block diagram of the apparatus 701 being incorporated into a safety cutoff switch of a solar power generation system. Auxiliary input power is fed to an auxiliary power circuit 801 whose primary purpose is to recondition the power to appropriate levels for the controller 802, and monitor the health and status of the module, including temperature and input voltage levels. If the voltage falls out of a predefined specified range, or if the temperature becomes too high, the controller 802 signals the driver circuit 803 to open the main photovoltaic power switch 804. The apparatus 701 monitors the auxiliary input power, photovoltaic input power, and the ambient environment. If a sustained level disturbance or pulse disturbance that matches the characteristics of an EMP or solar storm is detected, an alarm discrete indication signal is sent to the controller circuit 802 to force the driver circuit 803 to open the main switch, disconnecting photovoltaic power. An alternative embodiment is to have the apparatus 701 send the alarm discrete indication signal directly to the driver circuit 803 to trigger the opening of the main photovoltaic power switch 804. In this embodiment, the apparatus 701 could draw its power either from a self-contained energy storage device, such as a battery, or from the auxiliary power input, the photovoltaic input, or some external tertiary power source.

Figure 9:
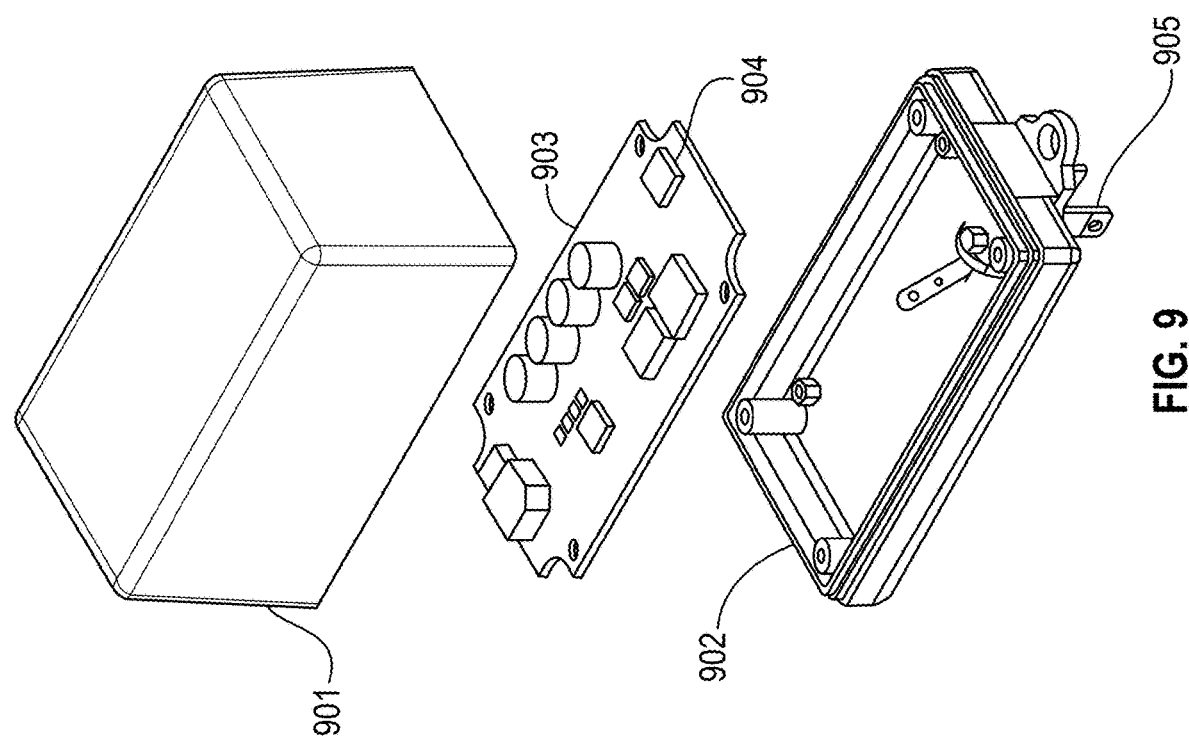
FIG. 9 illustrates a conceptual drawing of a plug-in module housing an embodiment according to embodiments of the present inventions.

FIG. 9 illustrates an embodiment of a plug-in module housing an embodiment. For purposes of protecting the contained electronics, the top 901 and bottom 902 of the housing may be layered with a conductive shielding material to reduce the radiated energy coupling into the circuits. Circuitry is constructed on a printed circuit board assembly 903 and mounted to the housing. The antenna 904 could be an onboard component or mounted either internal or external to the housing 901 and 902. The alternating current (AC) wall plug 905 is shown on the underside of the bottom housing 902. Similarly, an alternative embodiment could draw direct current (DC) power from the auxiliary receptacle of a vehicle rather than from an AC wall outlet.

Figure 10:
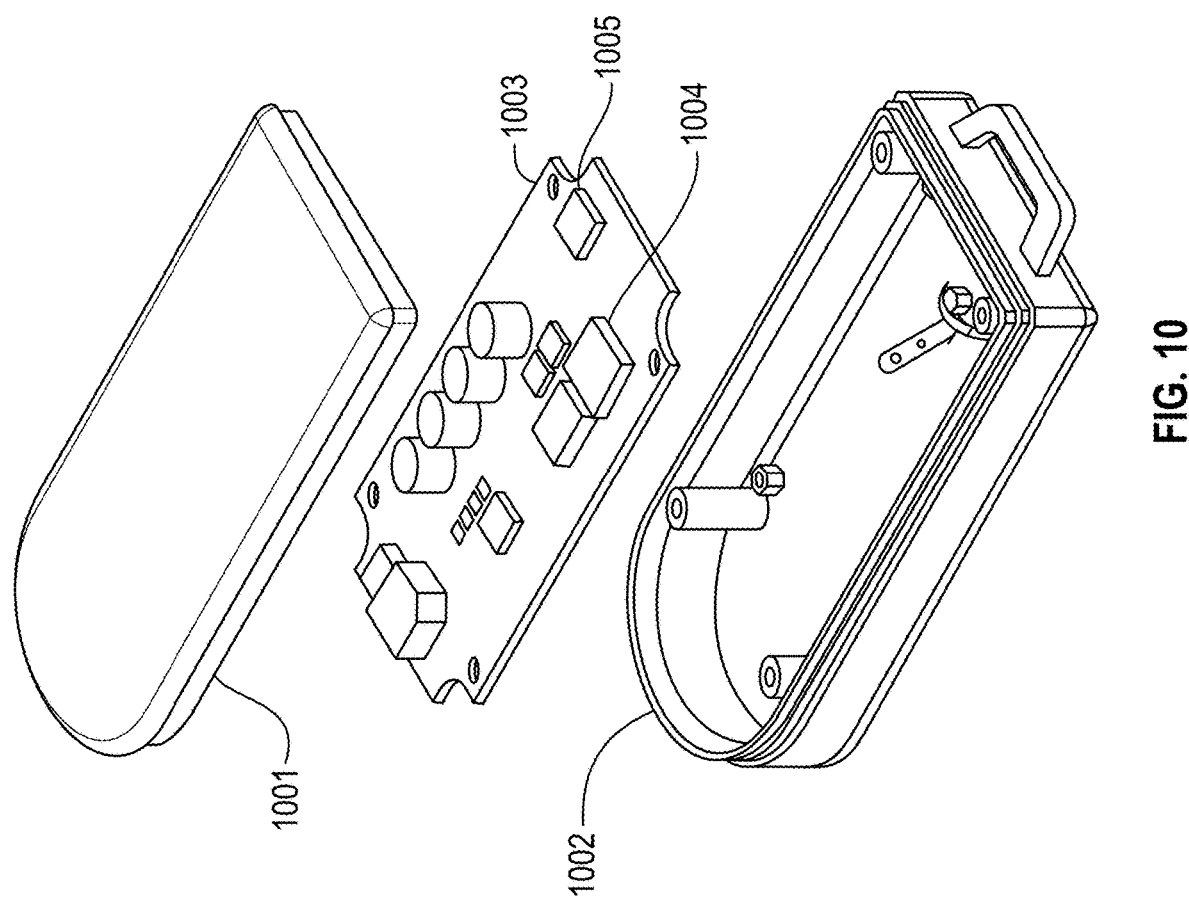
FIG. 10 illustrates a conceptual drawing of a battery-powered key fob module housing an embodiment according to embodiments of the present inventions.

FIG. 10 illustrates an embodiment of a battery-operated key fob module housing an embodiment. For purposes of protecting the contained electronics, the top 1001 and bottom 1002 of the housing may be layered with a conductive shielding material to reduce the radiated energy coupling into the circuits. Circuitry is constructed on a printed circuit board assembly 1003 and mounted to the housing. The antenna 1005 could be an onboard component or mounted either internal or external to the housing 1001, 1002. A battery or other energy storage device, 1004, would also be included, along with energy management hardware to maximize usable life.

Figure 11:
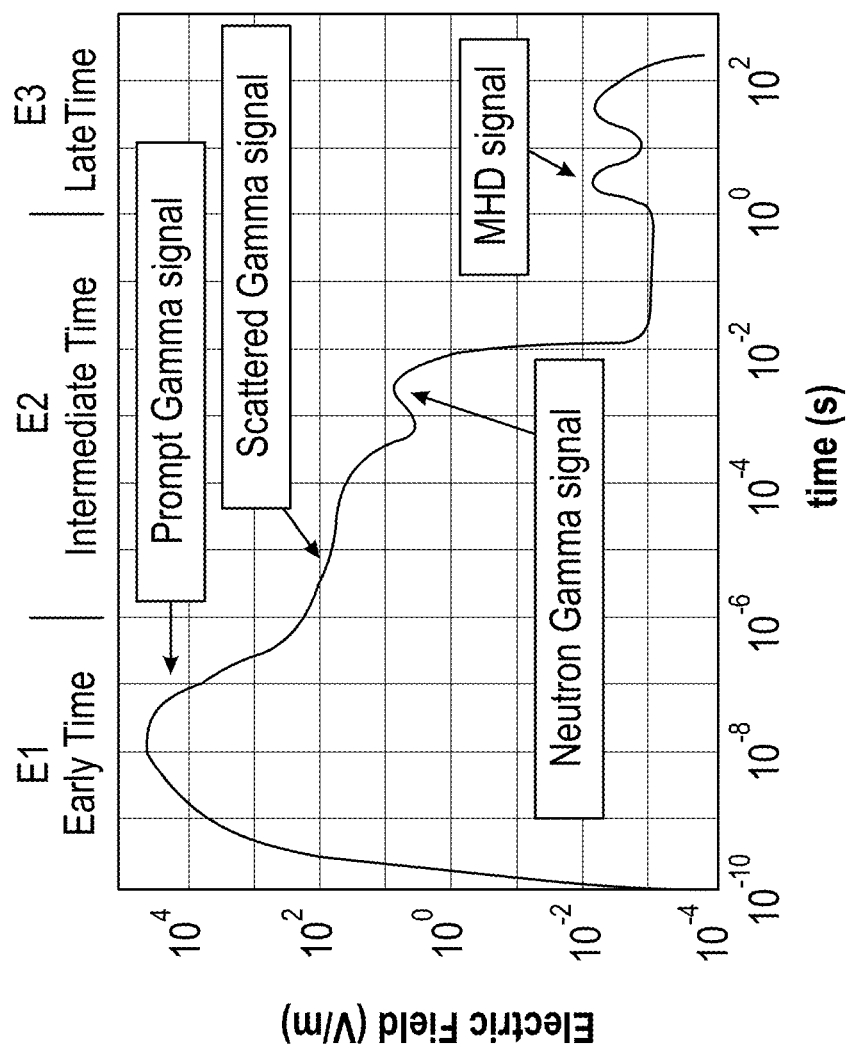
FIG. 11 illustrates a plot showing characteristics of a high-altitude nuclear-generated electromagnetic pulse (EMP) waveform over time.

FIG. 11 illustrates a plot showing characteristics of a high-altitude nuclear-generated electromagnetic pulse (EMP) waveform over time. An EMP results in a complex transient disturbance with three distinct phases, identified as E1, E2, and E3. The waveform of the early time E1 phase has a rise time of approximately 3 ns and a pulse width of approximately 20 ns. It is followed by the intermediate time waveform component of phase E2, which has a pulse width on the order of microseconds. Finally, the late time waveform of phase E3, might last from seconds to hours in duration. Similarly, the waveform resulting from a solar storm is comparable to the E3 of an EMP, with a duration lasting from seconds to hours.

As shown in FIG. 11, nuclear-generated EMP is described as comprising three distinct phases: the early time event, E1, the intermediate time event, E2, and the late time event, E3. During E1, the electromagnetic disturbance is an extremely brief, broad-band pulse lasting nanoseconds to hundreds of nanoseconds with amplitudes reaching tens of thousands of volts per meter, making it capable of disrupting a wide array of electronic systems. During E2, the electromagnetic disturbance is comparable in duration to lightning, lasting microseconds, and with amplitudes of exceeding one hundred volts per meter, lending itself to coupling most efficiently onto medium and long conductors. During E3, the electromagnetic disturbance is a sustained pulse, lasting seconds to hours that, while low in amplitude, can introduce damaging currents onto very long conductors, such as those of the power grid. A solar storm can also result in an electromagnetic disturbance felt at the Earth's surface similar to the E3 component of an EMP, with the disturbance lasting from seconds to hours and coupling most efficiently into very long conductors.

The present inventions are particularly useful in the detection of a solar storm or EMP. Solar storms and EMPs both result in potentially damaging E3 electrical disturbances in infrastructures with long conductors, such as large-scale power distribution and telecommunications systems. These sustained disturbances propagate along the conductors to affect interconnected electronics, including those in supervisory control and data acquisition (SCADA) systems, computers, transceivers, and other sensitive electronic hardware. The present inventions specifically monitor the input power lines for sustained electrical disturbances indicative of an EMP or solar storm with durations from seconds to hours.

EMPs also generate powerful E1 and E2 electromagnetic pulse disturbances that propagate along conductors and through the air to couple directly into both large- and small-scale electronic assemblies, including but not limited to computers, microcontrollers, vehicles, radio systems, home appliances, and cellular telephones. The present inventions monitor the input power lines and the ambient environment for E1 and E2 electromagnetic pulse disturbances with durations ranging from nanoseconds to microseconds.

FIG. 12 summarizes the waveform components resulting from an EMP. The E1 component has a duration of nanoseconds and is capable of coupling into both small- and large-scale electronics through radiated and conducted means. The E2 component has a duration of microseconds and is capable of coupling into both small- and large-scale electronics through radiated and conducted means. The E3 component has a duration ranging from seconds to hours and couples into large-scale infrastructures, such as the power grid, by induction, and is then distributed to both large and small systems through conduction.

Figure 13:
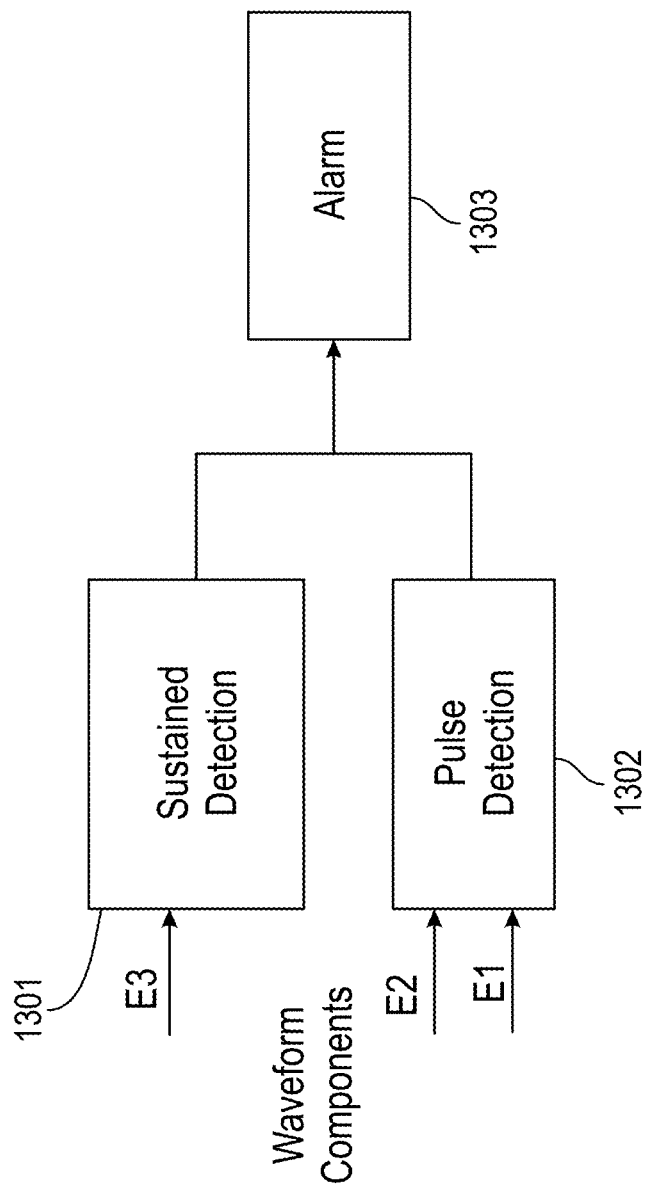
FIG. 13 summarizes how the three waveform components associated with the E1, E2, and E3 phases of an EMP are detected by the apparatus's detection circuitry.

FIG. 13 illustrates how the sustained detection circuit and pulse detection circuit are used to detect the various waveform components associated with the different phases of an EMP or solar storm. The sustained disturbance detection circuit 1301 detects waveforms associated with the E3 phase of an EMP, as well as the E3 waveform resulting from a solar storm or other long-duration electrical disturbance. The pulse detection circuit 1302 detects transient electromagnetic pulse disturbances associated with E1 and E2 phases. Once detected, an alarm is activated that provides a visual indicator, audible indicator, and a discrete indication signal.

In summary, the present inventions detect complex, time-variant conducted and radiated disturbances associated with an EMP or solar storm. The present inventions provide visual and audible warnings, as well as a discrete indication signal that can be used to disconnect or redirect the flow of electricity. The detection of an EMP or solar storm would provide early warning of potentially damaging events, allowing protective actions to be taken.

Examples of Intended Uses

The present inventions can be used to monitor the voltage levels of electrical power lines feeding a home, business, military structure, trailer, recreational vehicle, boat, automobile, or other electrical-powered structure, system, or device. When voltage levels on the power lines move outside of acceptable predetermined voltage levels (i.e., normal operating range), the sustained level detection circuit warns the user with visual alarms, audible alarms, and a discrete indication signal that can be used to drive or trigger power disconnect circuitry. Additionally, the pulse detection circuit monitors both the incoming power lines and the ambient environment for transient electromagnetic pulse disturbances associated with E1 and E2 phases of an EMP or solar storm.

The present inventions are designed with numerous built-in protections, including shielding and transient surge protection devices to ensure device survival during the EMP or solar storm disturbance events. Additionally, they are designed to operate at very high or low voltage levels, ensuring that the device continues to operate through the disturbance.

The present inventions provide a unique, robust method of providing early warning of an EMP or solar storm, enabling the user the opportunity to take appropriate protective actions. Such actions might include opening the main breaker on their home or business, unplugging critical or susceptible electrical devices, disconnecting the antennas from a radio system, preparing to evacuate the area, or warning others of the event. Additionally, embodiments could be incorporated into an automated power switching system, such as an automatic breaker or transfer switch, to automatically disconnect or reroute power when EMP or solar storm disturbances are detected. Likewise, embodiments could be used to drive an electromechanical actuator or mechanism to physically trip the power disconnect (e.g., main breaker) in the event of a potentially harmful disturbance. Additionally, they could be incorporated into a solar power generation system safety cutoff switch, providing another input condition under which the cutoff switch disconnects power coming from the photovoltaic array. Finally, it could be added to a surge protection device (SPD) to provide visual warning, audible warning, or an indication signal used to interrupt the flow of electricity.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

Any trademarks listed herein are the property of their respective owners, and reference herein to such trademarks is generally intended to indicate the source of a particular product or service.

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. An apparatus for detecting transient electromagnetic pulse disturbances associated with at least one of E1 and E2 phases of an electromagnetic pulse, comprising, an electromagnetic pulse sensitive feed comprising an AC mains power supply line for receiving a received signal;
   a pulse detector operatively coupled to the electromagnetic pulse sensitive feed to detect pulse disturbance durations in at least one of microseconds and nanoseconds to output a detected pulse indication signal;
   wherein the pulse detector comprises an activation circuit to convert the detected pulse indication signal to an alert signal; and
   an alarm operatively coupled to the activation circuit for indicating on the alert signal; and
   wherein the apparatus including the pulse detector and activation circuit is contained in a housing and further comprises at least a pair of AC mains wall plug prongs extending through a side of the housing and operatively coupled to the AC mains power supply line.

2. An apparatus according to claim 1, wherein the pulse detector is operatively coupled to the electromagnetic pulse sensitive feed to detect pulse disturbance durations in nanoseconds.

3. An apparatus according to claim 1, wherein the pulse detector is operatively coupled to the electromagnetic pulse sensitive feed to detect pulse disturbance durations in microseconds.

4. An apparatus according to claim 1, wherein the pulse detector is operatively coupled to the electromagnetic pulse sensitive feed to detect pulse disturbance durations in both nanoseconds and microseconds.

5. An apparatus according to claim 1, wherein the pulse detector is operatively coupled to the electromagnetic pulse sensitive feed to perform at least one of edge, pulse, and impulse detection of the received signal to output a detected pulse indication signal.

6. An apparatus according to claim 1, wherein the pulse detector comprises a differentiating diode and produces an impulse having amplitude indicative of a slope of the signal from the antenna feed and converts the received signal to the alert signal.

7. An apparatus according to claim 1, wherein the pulse detector is chosen from the group consisting of monostable multivibrators, peak detection devices, high-speed samplers, flip flops, high-gain comparators, and very fast turn on time transient protection devices.

8. An apparatus according to claim 1, wherein the activation circuit comprises a latch coupled to the alarm.

9. An apparatus according to claim 1, wherein the electromagnetic pulse sensitive feed further comprises an antenna feed.

10. An apparatus according to claim 9, wherein the antenna feed comprises an antenna coupled to a filter between the antenna and the pulse detector.

11. An apparatus according to claim 10, wherein the antenna has an electrical length with a resonant frequency tuned to a frequency spectrum of the transient electromagnetic pulse disturbances associated with at least one of E1 and E2 phases of an electromagnetic pulse.

12. An apparatus according to claim 10, wherein the filter passes pulse disturbance durations ranging from nanoseconds to microseconds.

13. An apparatus according to claim 10, wherein the filter passes pulse disturbance durations of about 20 nanoseconds.

14. An apparatus according to claim 10, wherein the filter passes pulse disturbance durations of about 10 nanoseconds.

15. An apparatus according to claim 9, wherein the housing is a handheld portable housing and further comprises a battery operatively coupled to the alarm and the pulse detector to power the alarm and the pulse detector.

16. An apparatus according to claim 1, further comprising a line filter, the line filter operatively coupled between the AC mains power supply line and an input to the pulse detector, the line filter producing another received signal to input to the pulse detector.

17. An apparatus according to claim 16, wherein the line filter passes pulse disturbance durations ranging from nanoseconds to microseconds.

18. An apparatus according to claim 1, wherein the alarm comprises an indicator chosen from the group consisting of a visual indicator, an audible indicator, and a discrete indication signal.

19. An apparatus according to claim 1, further comprising a sustained level detection circuit for detecting transient electromagnetic pulse disturbances associated with E3 phases of at least one of an electromagnetic pulse and a solar storm on the AC mains power supply line, the sustained level detection circuit comprising
   a low-pass filter operatively coupled to the AC mains power supply line; and
   a discriminator circuit operatively coupled to the low-pass filter for sending a signal indicating the low-pass filter output exceeds an over-voltage level.

20. An apparatus according to claim 19, wherein in the sustained level detection circuit the low-pass filter has a time constant of about 100 milliseconds to generate a low-pass filter output.

21. An apparatus according to claim 19, wherein the discriminator circuit comprises a comparitor circuit for sending the signal when an output of the low-pass filter passes a predetermined voltage setpoint.

22. An apparatus according to claim 19, the sustained level detection circuit further comprises a rectifier operatively coupled between the AC mains power supply line the low-pass filter.

23. An apparatus according to claim 19, wherein the sustained level detection circuit further comprises a pulse train converter for producing a signal having pulse widths indicative of voltage level of a signal input to the pulse train converter.

24. An apparatus according to claim 19, wherein the pulse train converter comprises an optocoupler operatively coupled between the AC mains power supply line the low-pass filter.

25. An apparatus according to claim 19, the sustained level detection circuit further comprises a Zener diode operatively coupled between the AC mains power supply line the pulse train converter to limit a turn on voltage of the pulse train converter.

26. An apparatus according to claim 19, wherein the discriminator circuit is operatively coupled to the low-pass filter for also sending a signal indicating the low-pass filter output falls below an under-voltage level.

27. An apparatus according to claim 19,
wherein the alarm comprises a first indicator and a second indicator,
wherein the first indicator indicates a transient electromagnetic pulse disturbance detected by the pulse detector, and the second indicator indicates a sustained electrical disturbance detected by the sustained level detection circuit; and
wherein the first indicator and the second indicator are each chosen from the group consisting of a visual indicator, an audible indicator, and a discrete indication signal.

28. An apparatus according to claim 19, further comprising a switch operatively coupled to receive the signal from an output of the discriminator circuit and operatively coupled to a supply of electrical power to disconnect the supply of electrical power when the discriminator circuit sends the signal indicating the low-pass filter output exceeds the over-voltage level to protect from transient electromagnetic pulse disturbances associated with E3 phases of at least one of an electromagnetic pulse and a solar storm on the AC mains power supply line.

29. An apparatus according to claim 28, wherein the switch comprises a circuit breaker; and wherein the apparatus further comprising an electromechanical actuator to physically trip the circuit breaker.

30. An apparatus according to claim 19, further comprising a switch operatively coupled to receive the alert signal from the alarm and operatively coupled to a supply of electrical power to disconnect the supply of electrical power when the alarm sends the alert signal indicating the pulse detector detected pulse disturbance durations in at least one of microseconds and nanoseconds to protect from transient electromagnetic pulse disturbances associated with at least one of E1 and E2 phases of an electromagnetic pulse.

31. An apparatus according to claim 30, wherein the switch comprises a circuit breaker; and wherein the apparatus further comprising an electromechanical actuator to physically trip the circuit breaker.

32. An apparatus according to claim 19, further comprising a filter operatively coupled between the electromagnetic pulse sensitive feed and the pulse detector.

33. An apparatus according to claim 32, wherein the filter passes pulse disturbance durations ranging from nanoseconds to microseconds.

34. An apparatus according to claim 33, wherein the filter passes pulse disturbance durations of about 20 nanoseconds.

35. An apparatus according to claim 34, wherein the filter passes pulse disturbance durations of both 10 nanoseconds and 20 nanoseconds.

36. An apparatus according to claim 1, wherein the electromagnetic pulse sensitive feed and the pulse detector and the sustained level detection circuit each consists of discrete analog components for hardening to survive electromagnetic pulse disturbances associated with an electromagnetic pulse or a solar storm.

* * * * *